(12) United States Patent
Pinchart et al.

(10) Patent No.: US 8,324,014 B2
(45) Date of Patent: Dec. 4, 2012

(54) PROCESS FOR DEPOSITING BORON COMPOUNDS BY CVD OR PVD

(75) Inventors: Audrey Pinchart, Antony (FR); Denis Jahan, Suresnes (FR)

(73) Assignee: L'Air Liquide Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 258 days.

(21) Appl. No.: 12/741,642

(22) PCT Filed: Nov. 3, 2008

(86) PCT No.: PCT/FR2008/051980
§ 371 (c)(1),
(2), (4) Date: May 6, 2010

(87) PCT Pub. No.: WO2009/068769
PCT Pub. Date: Jun. 4, 2009

(65) Prior Publication Data
US 2010/0227430 A1 Sep. 9, 2010

(30) Foreign Application Priority Data
Nov. 7, 2007 (FR) .................................. 07 58844

(51) Int. Cl.
*H01L 21/00* (2006.01)
(52) U.S. Cl. .......... 438/96; 438/181; 438/185; 438/231; 438/232; 438/246; 438/247; 438/48; 438/814; 438/915; 427/248.1; 427/249.5; 257/E21.275; 257/E31.001

(58) Field of Classification Search .................. None
See application file for complete search history.

(56) References Cited

U.S. PATENT DOCUMENTS

| 5,646,075 | A | 7/1997 | Thakur et al. |
| 5,886,229 | A * | 3/1999 | Corella et al. .................. 568/1 |
| 6,100,202 | A | 8/2000 | Lin et al. |
| 2006/0286814 | A1 | 12/2006 | Kumada et al. |
| 2008/0029027 | A1 | 2/2008 | Kumada et al. |
| 2008/0038585 | A1 | 2/2008 | Kumada et al. |

FOREIGN PATENT DOCUMENTS

| EP | 1 788 119 | | 5/2007 |
| GB | 2434376 | * | 7/2007 |

(Continued)

OTHER PUBLICATIONS

Higuchi et al. ("High-Efficiency Delta-doped Amorphous Silicon Solar Cells Prepared by Photochemical Vapor Deposition", Japanese J. of Applied Physics, vol. 30 (8), pp. 1635-1640, 1991).*

(Continued)

*Primary Examiner* — Charles Garber
*Assistant Examiner* — Yasser Abdelaziez
(74) *Attorney, Agent, or Firm* — Patricia E. McQueeney

(57) ABSTRACT

The present invention relates to a process for depositing films on a substrate by chemical vapour deposition (CVD) or physical vapour deposition (PVD), said process employing at least one boron compound. This process is particularly useful for fabricating photovoltaic solar cells. The invention also relates to the use of boron compounds for conferring optical and/or electrical properties on materials in a CVD or PVD deposition process. This process is also particularly useful for fabricating a photovoltaic solar cell.

21 Claims, 3 Drawing Sheets

FOREIGN PATENT DOCUMENTS

| WO | WO 98 28463 | | 7/1998 |
|---|---|---|---|
| WO | WO 2007 058365 | | 5/2007 |
| WO | WO2007/058365 | * | 5/2007 |

OTHER PUBLICATIONS

Lewis et al. ("Chemical Vapor Deposition of Boron-Carbon films using Organometallic Reagents", Materials Letters, 27, pp. 327-332, 1996).*

Boo et al. ("Growth of Boron Nitride Thin Films on Silicon Substrates using new Organoboron Precursors", Phys. Stat. Sol. (a) 176, pp. 705-710, 1999).*

International Search Report for PCT/FR2008/051980, Jun. 4, 2009.

Boo, J-H et al., "Growth of boron nitride thin films on silicon substrates using new organoboron precursors," Physica Status Solidi A: Applied Research, 176(1), pp. 705-710, Jul. 2009.

Thamm et al., "Characterization of PECVD boron carbonitride layers," Applied Surface Science, Elsevier, Amsterdam, NL, vol. 252, No. 1, Sep. 30, 2005, pp. 223-226.

Weber, A. et al., "Electron cyclotron resonance plasma deposition of cubic boron nitride using N-trimethylborazine," Surface and Coatings Technology, Switzerland, vol. 60, No. 103, Oct. 8, 1993, pp. 493-497.

* cited by examiner

Figure 2A
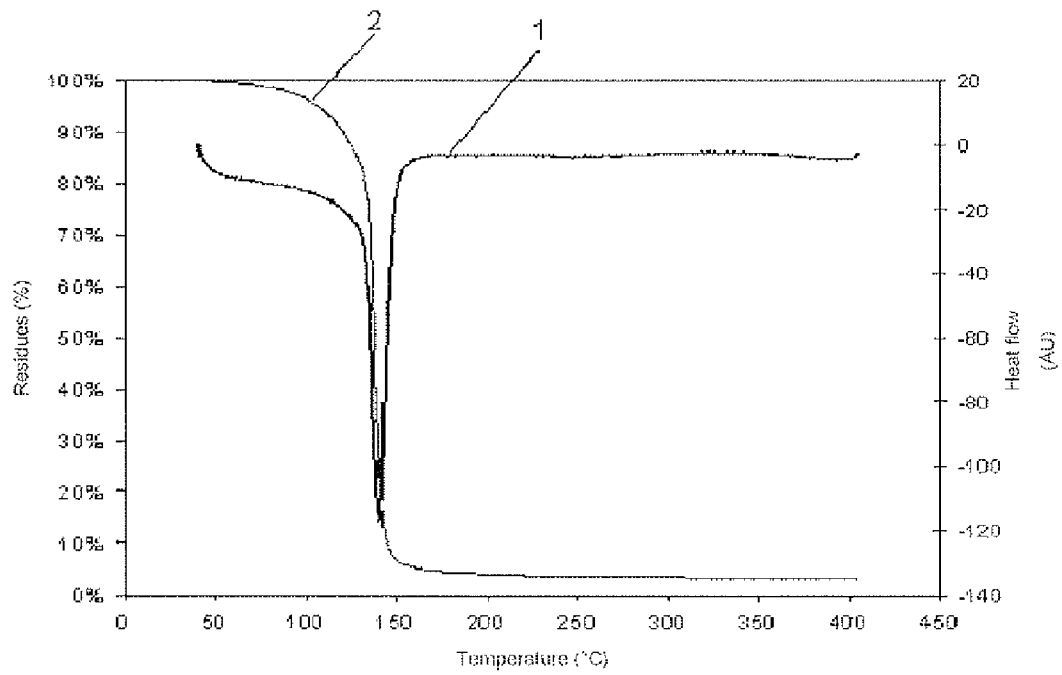
Figure 2B
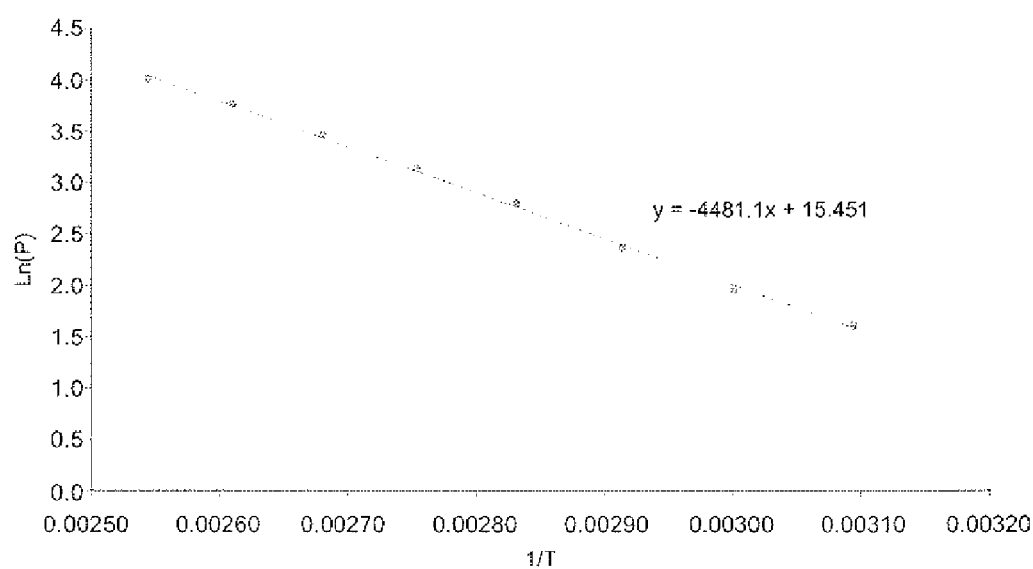
Figure 2

PROCESS FOR DEPOSITING BORON COMPOUNDS BY CVD OR PVD

This application is a 371 of International PCT Application PCT/FR2008/051980, filed Nov. 3, 2008, the entire contents of which are incorporated herein by reference.

The present invention relates to a process for depositing by chemical vapour deposition (CVD) or by physical vapour deposition (PVD) onto a support, said process using at least one boron compound. The invention also relates to the use of boron compounds for giving, in particular, optical and/or electrical properties to materials in a CVD or PVD deposition process.

The term "support" is understood within the context of the present invention to mean any type of material capable of providing mechanical strength, rigidity to the whole of the structure once the deposition has been carried out and/or of being coated with boron. Mention may be made, in particular, of steel and glass, but also of polymers (plastic films), paper, or else wood, and also semiconductor substrates.

BACKGROUND

Compounds comprising the element boron have many applications, in various fields. These compounds are used, for example, in the electronics industry, in the glass industry, in detergents, in enamels and ceramic glazes, in agriculture, in the iron and steel industry, in metallurgy, in cements and concretes, in paints, in nuclear power stations, and in the pharmaceutical field. These compounds can also be used for coating combustion chambers, turbine blades, tools, etc.

More particularly, some of these compounds are used for giving materials other properties, such as optical and electrical properties. For example, boron (a column III element) is widely used in the semiconductor industry where it serves as a dopant, especially in silicon or in transparent conducting oxides (TCOs) such as zinc oxide (ZnO).

The most commonly used techniques for applying a layer of boron and/or doping materials with boron are the CVD and PVD deposition techniques.

It is known to use, via the CVD technique, diborane ($B_2H_6$), trimethylborane ($B(CH_3)_3$ or TMB), triethylborane ($B(C_2H_5)_3$ or TEB) or boron trifluoride ($BF_3$) as precursors of the element boron to "p-type" dope thin films of silicon in order to produce, for example, solar cells.

Reference can also be made to documents U.S. Pat. No. 6,100,202 and U.S. Pat. No. 5,646,075 which mention the use of trimethylborate or triisopropylborate.

It is also known, via the CVD technique, how to dope transparent conducting oxides, such as zinc oxide, with boron by using diborane as a boron precursor. This doping allows these oxides to become conducting while retaining their transparency. TCOs are widely used materials since numerous applications seek the combination of optical transparency and electrical conductivity. Mention may in particular be made, as applications, of flat screens, de-icing windows, heat-reflective windows, electrochromic mirrors and windows, touch screens, electromagnetic shielding, electrostatic charge dissipation and solar cells.

Furthermore, it has been proposed to use boron tri-isopropoxide ($B(OiPr)_3$) as an agent for doping zinc oxide via the sol-gel technique.

However, these compounds have the major disadvantage of being dangerous to handle. For example, diborane and trimethylborane are highly flammable and very toxic. Specifically, a dose of 30 to 90 mg/m$^3$ of diborane is lethal after 4 hours of exposure to this product. As regards trimethylborane, it is a pyrophoric gas.

Furthermore, the cost of these compounds is very high.

A person skilled in the art seeks to use compounds that are less dangerous to handle while minimizing the costs, in order to increase the competitiveness of the end product.

Therefore, there remains the need to propose novel CVD and PVD deposition processes for which the costs are reduced, while optimizing safety during product handling.

SUMMARY

The Applicant has now discovered that it is possible to use, in CVD and PVD techniques, certain boron compounds that are less toxic and less expensive than those conventionally used, while retaining perfectly satisfactory deposition qualities.

Thus, the invention relates to a process for depositing by chemical vapour deposition (CVD) or by physical vapour deposition (PVD) onto a support, said process using at least one boron compound of formula (I):

in which:
$R_1$ represents a hydrogen, or a linear or branched alkyl having 4 or 5 carbon atoms, or a linear or branched alkoxy having 4 or 5 carbon atoms, or else an aryl, or an alkylamide, or a linear or branched hydroxyl having 1 to 5 carbon atoms; and $R_2$ and $R_3$ each independently represent a linear or branched alkyl having 4 or 5 carbon atoms, or a linear or branched alkoxy having 4 or 5 carbon atoms, or else an aryl, or an alkylamide, or a linear or branched hydroxyl having 1 to 5 carbon atoms or else $R_2$ and $R_3$ together form, with the boron atom to which they are attached, a saturated heterocycle having 6 ring members comprising 3 boron atoms and three nitrogen atoms arranged alternately in the ring, said heterocycle optionally being substituted by one to five substituents chosen from an alkyl having 1 to 5 carbon atoms, an aryl, an alkylamide and an alkoxy having 1 to 5 carbon atoms;

$R_1$, $R_2$ and $R_3$ not all being able to represent $CH_3$ or $C_2H_5$ simultaneously.

According to one of the embodiments of the invention, the compound of formula (I) is tri-n-butylborane:

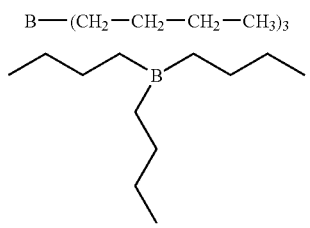

The boron compounds targeted by the present invention comprise, in particular, the compounds of formula (II) below (saturated heterocycle having 6 ring members):

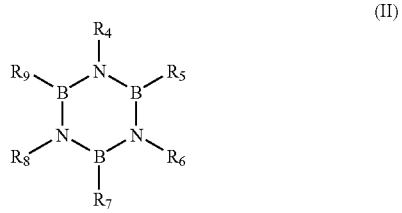
(II)

Preferably, in formula (I), $R_1$, $R_2$ and $R_3$ are identical.

According to another preferred embodiment, the compound of formula (I) (or (II)) is a compound of formula (Ia):

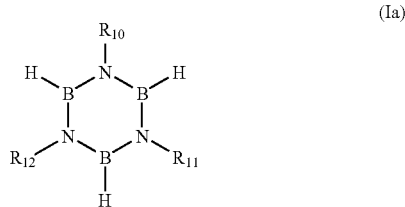
(Ia)

in which $R_{10}$, $R_{11}$ and $R_{12}$ each independently represent a hydrogen, or a linear or branched alkyl having 1 to 5 carbon atoms, or an aryl, or an alkylamide, or a hydroxyl, or else a linear or branched alkoxy having 1 to 5 carbon atoms;

or a compound of formula (Ib):

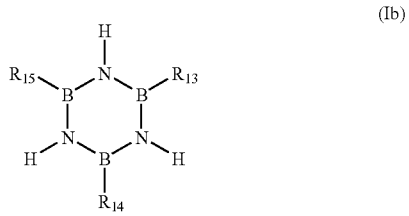
(Ib)

in which $R_{13}$, $R_{14}$ and $R_{15}$ each independently represent a hydrogen, or a linear or branched alkyl having 1 to 5 carbon atoms, or an aryl, or an alkylamide, or a hydroxyl, or a linear or branched alkoxy having 1 to 5 carbon atoms.

More preferably, in formula (Ia), the substituents $R_{10}$, $R_{11}$ and $R_{12}$ are identical. Advantageously, use is made of 1,3,5-trimethylborazine:

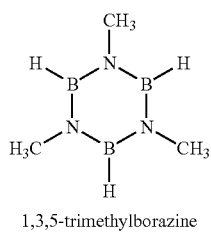

1,3,5-trimethylborazine

More preferably, in formula (Ib), the substituents $R_{13}$, $R_{14}$ and $R_{15}$ are identical.

The compounds according to the invention, such as 1,3,5-trimethylborazine, are considered to be slightly toxic to almost non-toxic with reference to the "LD50 (lethal dose 50) oral, rat" indicator corresponding to the dose of substance that leads to the death of 50% of a given animal population. The compounds used in the process according to the invention are therefore much less dangerous than those used in the prior art, such as diborane and trimethylborane, which are themselves respectively qualified as "lethal" and "very toxic".

The chemical vapour deposition technique includes any CVD-type deposition, that is to say any deposition based on a series of chemical reactions in a chamber that is generally placed at high temperature. Mention may be made, in particular, of AP-CVD (atmospheric pressure CVD), LP-CVD (low pressure CVD), PACVD (plasma-activated CVD or plasma-assisted CVD) also known as PECVD (plasma-enhanced CVD), or else HWCVD (hot-wire chemical vapour deposition), PCVD (photochemical vapour deposition), LICVD (light-induced chemical vapour deposition) and LCVD (laser chemical vapour deposition).

There are also several physical vapour deposition (PVD) techniques. Mention may be made, in particular, of the PVD technique of deposition via vacuum evaporation that consists in heating the material that it is desired to deposit under vacuum. The atoms of the material to be evaporated receive energy, that is to say that their vibrational energy exceeds the bond energy and causes the evaporation. The evaporated material is then recovered by condensation on the substrate to be coated. The evaporation may be electron bombardment evaporation, Joule effect evaporation, electric arc evaporation, induction evaporation, or ion beam assisted evaporation (ion beam assisted deposition or IBAD). Mention may also be made of the vacuum sputtering PVD deposition technique, which consists in ejecting particles from the surface of a solid via the bombardment of this surface with energetic particles, in general argon ions, for example magnetron sputtering, cathode sputtering or IBD (ion beam deposition); the ionic or ion-plating PVD deposition technique that comprises the evaporation of a material in a chamber in which a residual pressure of 13 to 1.3 Pa is maintained by introducing argon, for example; and the molecular beam epitaxy (MBE) and chemical beam epitaxy (CBE) techniques.

According to one particular embodiment, the deposition process according to the invention makes it possible to "p-type" dope silicon and/or germanium with boron.

The silicon and/or germanium may be in amorphous form or in microcrystalline form.

The boron precursor of formula (I) (therefore including, in particular, the formulae I, II, Ia, Ib) is introduced into the CVD or PVD reactor during the growth of the silicon and/or germanium layers.

By receiving trivalent impurities such as boron, a silicon and/or germanium crystal becomes a "p-type" semiconductor (excess of holes) via substitution of a silicon or germanium atom with a boron atom in the crystal lattice. Such a "p-type" semiconductor may be juxtaposed with an "n-type" semiconductor (excess of electrons) to form a "p-n" junction. The "p-n" junction is the basis of the electronic component known as a diode, which only allows electric current to flow in one direction. Similarly, a third region may be doped to obtain double "n-p-n" or "p-n-p" junctions that form bipolar transistors.

"p-i-n" or "n-i-p" junctions may also be produced in which the "i" layer, called the intrinsic region, corresponds to an undoped layer of silicon and/or germanium. These junctions are particularly used in the manufacture of photovoltaic solar cells.

According to another particular embodiment, the process according to the invention makes it possible to dope a TCO layer and preferably a zinc oxide layer.

The boron precursor of formula (I) (therefore including, in particular, the formulae I, II, Ia, Ib) is introduced into the CVD or PVD reactor during the growth of the TCO layer.

Another subject of the invention is the use of at least one boron compound of formulae as described previously for manufacturing a photovoltaic solar cell or for manufacturing a flat screen.

A photovoltaic solar cell generally comprises a "p-i-n" junction, a TCO layer such as a zinc oxide layer, and a substrate. One of the techniques for manufacturing a solar cell is the thin-film deposition technique.

The doping of the "p-type" layer of silicon and of the zinc oxide layer with boron is carried out at the same time as the deposition of these layers.

The doping of the silicon and/or germanium layer and of the zinc oxide layer is carried out either using the same dopant, or using a different dopant.

For the doping of a given layer, several dopants may also be used.

Another subject of the invention is the use of boron compounds of formulae as described previously for giving optical and/or electrical properties to materials in a CVD or PVD deposition process.

BRIEF DESCRIPTION OF DRAWINGS

Other features and advantages of the invention will appear on reading the description which follows. Forms and embodiments of the invention are given by way of non-limiting examples, illustrated by the appended drawings in which:

FIGS. 2A and 2B illustrate the results of thermogravimetric analysis of 1,3,5-trimethylborazine;

DESCRIPTION OF PREFERRED EMBODIMENTS

Figure 1:
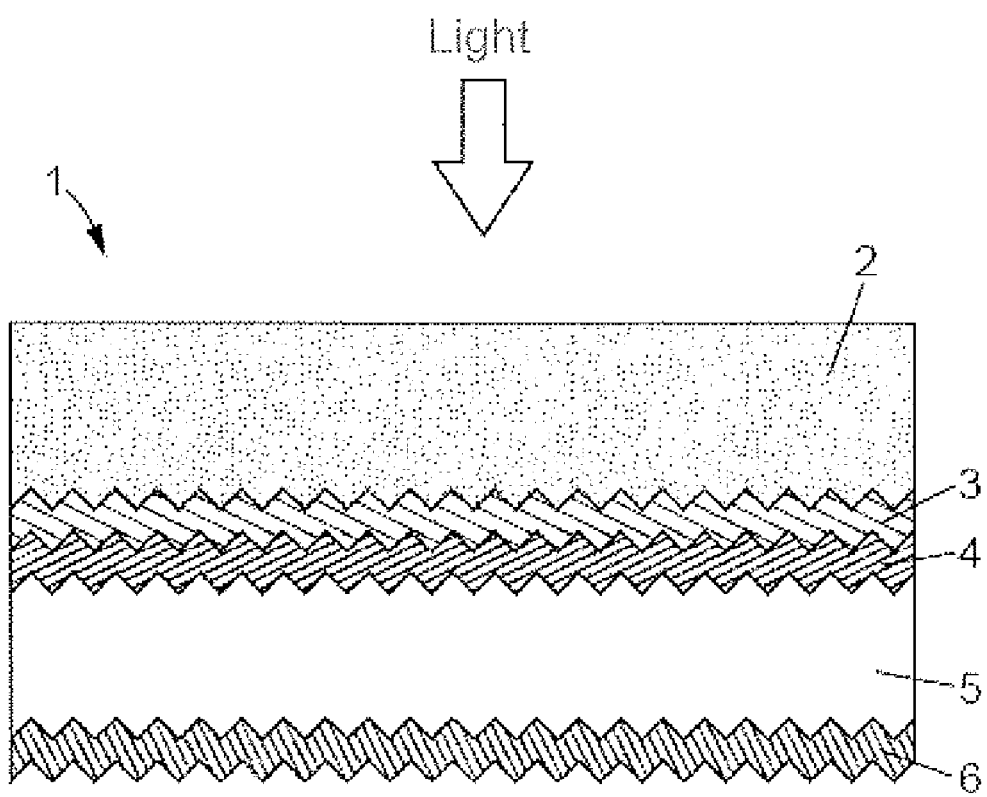
FIG. 1 represents a view of the various layers that make up a photovoltaic solar cell.

FIG. 1 illustrates an example of a photovoltaic solar cell 1 that comprises glass 2 as a support, successively deposited onto which are: a transparent conducting layer 3 made of boron-doped zinc oxide, a "p-type" layer of boron-doped silicon 4, an "i-type" layer of undoped silicon 5 and an "n-type" layer of phosphorus-doped silicon 6.

The invention will now be illustrated by the following non-limiting examples.

EXAMPLES

Example 1

Thermogravimetric Analysis of 1,3,5-trimethylborazine and Measurement of its Vapour Pressure

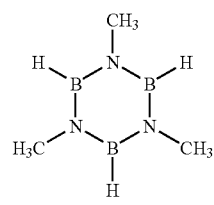

1,3,5-trimethylborazine

FIGS. 2A and 2B illustrate this example.

A thermogravimetric analysis of 1,3,5-trimethylborazine was carried out over a temperature ramp of 20 to 400° C., with a rise of 10° C./min under 30 mL/min of helium.

Curve 1 from FIG. 2A plotted as a dark line represents the difference in heat flow between the standard crucible and the crucible containing the sample as a function of the temperature. Its boiling point is 140° C.

Curve 2 from FIG. 2A plotted as a lighter line represents the loss in mass of the sample as a function of the temperature. The final value of the residue level of 3.2% indicates a high purity and good thermal stability of 1,3,5-trimethylborazine. This residue level is reached at 165° C. This temperature is the final evaporation temperature of the compound and demonstrates its good volatility.

The curve plotted in FIG. 2B represents the Clausius-Clapeyron diagram of the 1,3,5-trimethylborazine molecule, namely its vapour pressure measurement. 1,3,5-trimethylborazine has a vapour pressure of 40 Torr at 50° C. and greater than 200 Torr at 100° C., indicating a good volatility.

This very volatile and thermally stable compound is consequently perfectly suitable for being used for CVD and PVD depositions, in particular for the doping, via CVD, of thin films of silicon and/or of germanium, and of zinc oxide.

Example 2

Incorporation of boron into a Layer of ZnO With 1,3,5-trimethylborazine

Figure 3:
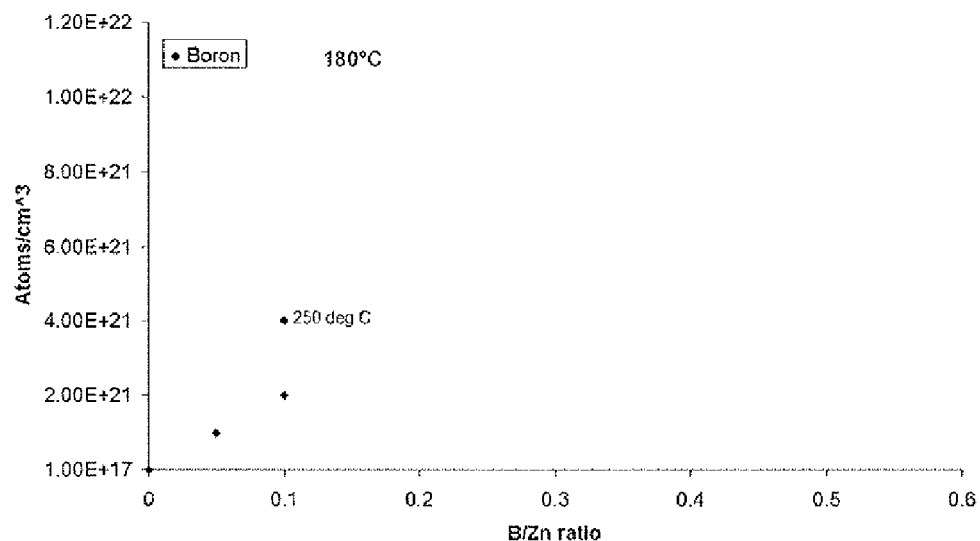
FIG. 3 illustrates the results obtained in the case of incorporating boron into a layer of ZnO with 1,3,5-trimethylborazine.

FIG. 3 illustrates this example.

Thin films of zinc oxide were deposited by the MOCVD technique, then the doping of these films was carried out using 1,3,5-trimethylborazine. Various ratios between the amount of boron and the amount of zinc were tested in order to find out the link between the concentration of the boron molecule and the number of boron atoms incorporated into the zinc oxide layer. The majority of these tests were carried out at 180° C. then one point was carried out at 250° C.

A good incorporation of boron into the zinc oxide layers is observed. This shows that this compound can be applied in the deposition processes due to its good volatility and its thermal stability. This incorporation of boron atoms into the thin film also shows that this 1,3,5-trimethylborazine molecule may act as a dopant. The relationship between the B/Zn ratio and the incorporation of the number of boron atoms into the thin film of zinc oxide is proportional.

This compound is therefore suitable for being used in CVD and PVD depositions, in particular for the doping, via CVD, of thin films of silicon and/or of germanium, and of zinc oxide.

Example 3

Thermogravimetric Analysis of tri-n-butyl-borane

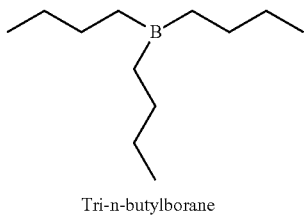

Tri-n-butylborane

Figure 4:
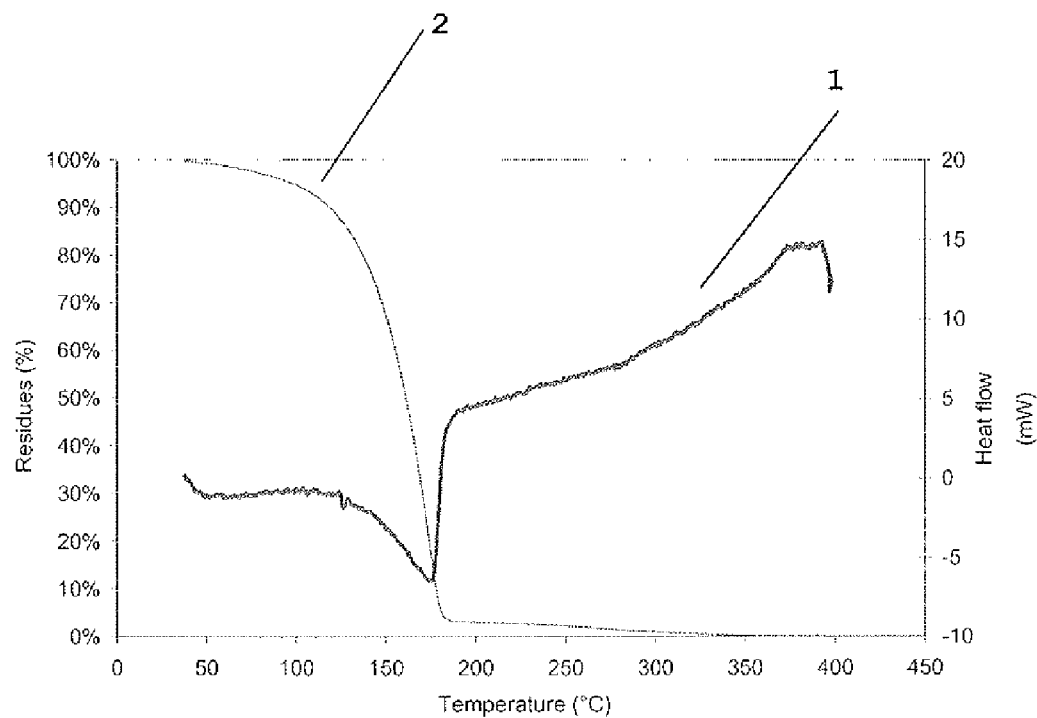
FIG. 4 illustrates the results of thermogravimetric analysis of tri-sec-butylborane.

FIG. 4 illustrates the results obtained in the context of this example.

Thermogravimetric analysis of tri-butylborane was carried out over a temperature ramp of 20 to 400° C., with a rise of 10° C./min under 30 mL/min of helium.

Curve 1 from FIG. 4 plotted as a dark line represents the difference in heat flow between the standard crucible and the crucible containing the sample as a function of the temperature. Its boiling point is 175° C.

Curve 2 from FIG. 4 plotted as a lighter line represents the loss in mass of the sample as a function of the temperature.

The final value of the residue level of 0.6% indicates a high purity and good thermal stability of tri-n-butylborane. This residue level is reached at 185° C. This temperature is the final evaporation temperature of the compound and demonstrates its good volatility.

This very volatile and thermally stable compound is consequently perfectly suitable for being used for CVD and PVD depositions, in particular for the doping, via CVD, of thin films of silicon and/or of germanium, and of zinc oxide.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What claimed is:

1. A process for depositing a boron doped material onto a support by chemical vapour deposition or by physical vapour deposition, the process comprising: introducing at least one boron compound into a reactor during growth of a material on the support, said boron compound being selected from the group consisting of 1,3,5-trimethylborazine of formula:

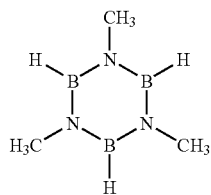

wherein the material is selected from the group consisting of a semiconductor material, a transparent conducting oxide, and mixtures thereof.

2. The process of claim 1, wherein the boron doped material and support are components of a photovoltaic solar cell.

3. The process of claim 1, wherein the at least one boron compound provides optical and/or electrical properties to the material.

4. The process of claim 1, wherein the support is selected from the group consisting of glass, steel, polymers, paper, wood, and semiconductor substrates.

5. The process of claim 2, wherein the support is selected from the group consisting of glass, steel, polymers, paper, wood, and semiconductor substrates.

6. The process of claim 3, wherein the support is selected from the group consisting of glass, steel, polymers, paper, wood, and semiconductor substrates.

7. The process of claim 1, wherein the material is selected from the group consisting of silicon, germanium, a transparent conducting oxide, and mixtures thereof.

8. The process of claim 2, wherein the material is selected from the group consisting of silicon, germanium, a transparent conducting oxide, and mixtures thereof.

9. The process of claim 3, wherein the material is selected from the group consisting of silicon, germanium, a transparent conducting oxide, and mixtures thereof.

10. The process of claim 7, wherein the silicon and/or the germanium are in amorphous form.

11. The process of claim 10, wherein the silicon and/or the germanium are in amorphous form.

12. The process of claim 9, wherein the silicon and/or the germanium are in amorphous form.

13. The process of claim 7, wherein the silicon and/or the germanium are in microcrystalline form.

14. The process of claim 8, wherein the silicon and/or the germanium are in microcrystalline form.

15. The process of claim 9, wherein the silicon and/or the germanium are in microcrystalline form.

16. The process of claim 1, wherein the material is a transparent conducting oxide.

17. The process of claim 16, wherein the transparent conducting oxide is zinc oxide.

18. The process of claim 2, wherein the material is a transparent conducting oxide.

19. The process of claim 18, wherein the transparent conducting oxide is zinc oxide.

20. The process of claim 3, wherein the material is a transparent conducting oxide.

21. The process of claim 20, wherein the transparent conducting oxide is zinc oxide.

* * * * *